United States Patent
Garg et al.

(10) Patent No.: US 12,234,194 B2
(45) Date of Patent: Feb. 25, 2025

(54) HIGH TEMPERATURE COMPOSITE MATERIALS WITH EROSION RESISTANT SEAL COAT

(71) Applicant: RTX Corporation, Farmington, CT (US)

(72) Inventors: Nitin Garg, West Hartford, CT (US); Olivier H. Sudre, Glastonbury, CT (US); Richard Wesley Jackson, Mystic, CT (US)

(73) Assignee: RTX CORPORATION, Farmington, CT (US)

( * ) Notice: Subject to any disclaimer, the term of this patent is extended or adjusted under 35 U.S.C. 154(b) by 734 days.

(21) Appl. No.: 17/383,808

(22) Filed: Jul. 23, 2021

(65) Prior Publication Data

US 2023/0027473 A1     Jan. 26, 2023

(51) Int. Cl.

| | | |
|---|---|---|
| *C04B 41/45* | (2006.01) | |
| *C04B 35/80* | (2006.01) | |
| *C04B 41/00* | (2006.01) | |
| *C04B 41/50* | (2006.01) | |
| *C04B 41/87* | (2006.01) | |

(52) U.S. Cl.
CPC .......... *C04B 41/4531* (2013.01); *C04B 35/80* (2013.01); *C04B 41/009* (2013.01); *C04B 41/4596* (2013.01); *C04B 41/5059* (2013.01); *C04B 41/87* (2013.01); *C04B 2235/3826* (2013.01); *C04B 2235/5244* (2013.01)

(58) Field of Classification Search
CPC ............ C04B 2235/5244; C04B 35/56; C04B 35/565; C04B 35/80; C04B 41/009; C04B 41/4531; C04B 41/4545; C04B 41/4596; C04B 41/5024; C04B 41/5025; C04B 41/5042; C04B 41/5059; C04B 41/52; C04B 41/522; C04B 41/87; C04B 41/89; C23C 16/45512; F01D 5/282; F01D 5/284; F01D 5/288; F05D 2230/314; F05D 2300/2112; F05D 2300/2118; F05D 2300/212; F05D 2300/22; F05D 2300/226; F05D 2300/228; F05D 2300/6033

See application file for complete search history.

(56) References Cited

U.S. PATENT DOCUMENTS

| | | | |
|---|---|---|---|
| 5,154,862 A | 10/1992 | Reagan et al. | |
| 9,611,181 B2 | 4/2017 | Tang et al. | |
| 10,392,312 B2 | 8/2019 | Tang et al. | |
| 10,604,454 B1 | 3/2020 | Zhu et al. | |
| 2005/0112399 A1 | 5/2005 | Gray et al. | |
| 2011/0200759 A1* | 8/2011 | Tang | C04B 41/52 |
| | | | 427/452 |
| 2017/0073277 A1* | 3/2017 | Shim | C04B 41/009 |
| 2021/0188720 A1 | 6/2021 | Ding et al. | |

FOREIGN PATENT DOCUMENTS

WO    2005056872 A1    6/2005

OTHER PUBLICATIONS

Extended European Search Report for EP Application No. 22184516. 7; Report mail date Dec. 12, 2022 (7 pages).
Reagen, P., "Chemical vapor composites (CVC)", Journal de Physique IV Proceedings, EDP Sciences, 1993, 03 (C3), pp. C3-541-C3-548.
ThermoTrex Corporation, "Development of Chermical Vapor Composite, (CVC) Ceramic Materials", Status Report Apr. 1995-Jun. 1997; TTC-3838-R, Jul. 25, 1997, Copy No. 2; 14 pages.

* cited by examiner

*Primary Examiner* — Frances Tischler
(74) *Attorney, Agent, or Firm* — CANTOR COLBURN LLP

(57) ABSTRACT

Disclosed is a coated composite comprising a seal coat disposed on a composite material wherein the seal coat comprises protective particles and a matrix.

14 Claims, 1 Drawing Sheet

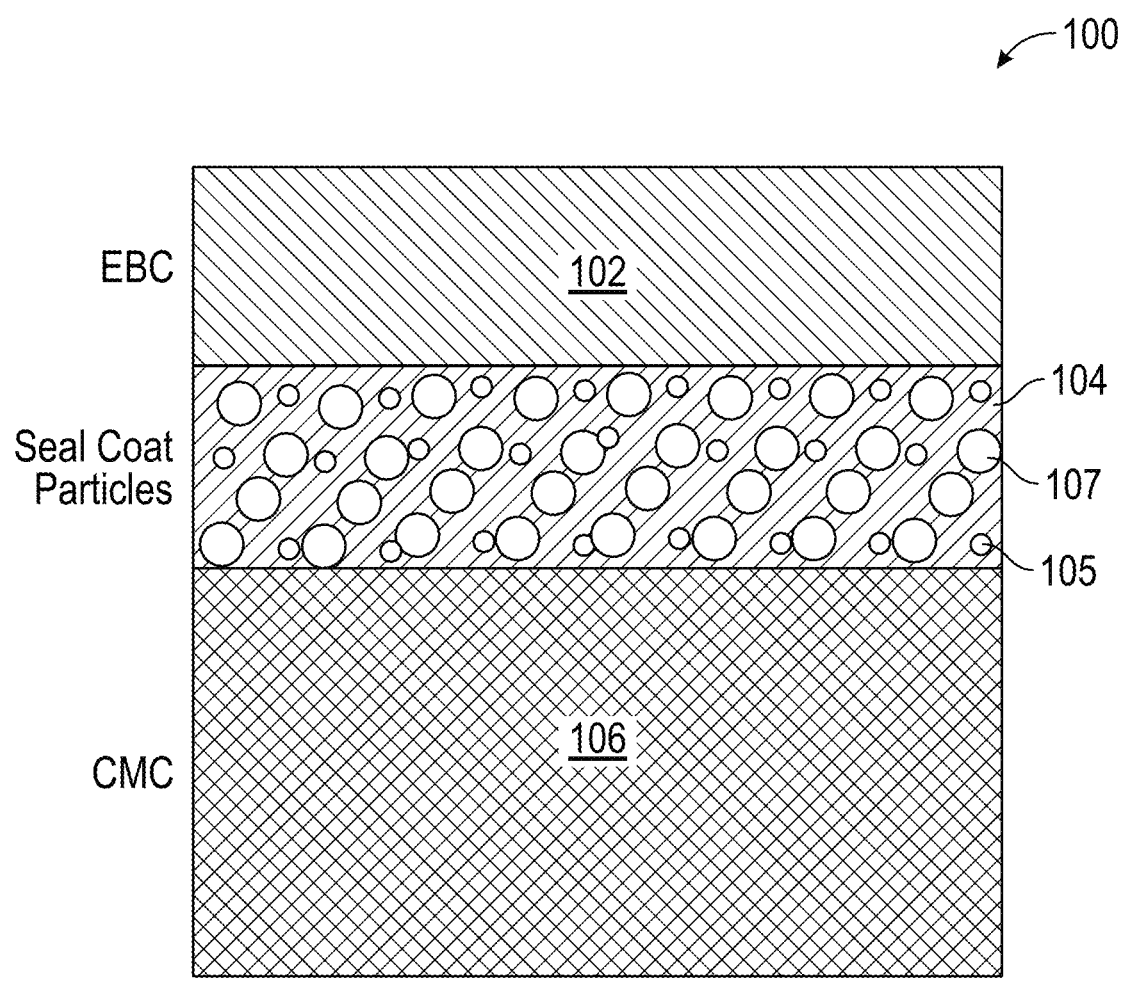

HIGH TEMPERATURE COMPOSITE MATERIALS WITH EROSION RESISTANT SEAL COAT

BACKGROUND

Exemplary embodiments of the present disclosure pertain to the art of high temperature composite materials.

High temperature composites, such as ceramic matrix composites are used in a range of applications. These composites can demonstrate degradation when exposed to high speed water vapor. It would be helpful to decrease degradation and improve the useful life of high temperature composites.

BRIEF DESCRIPTION

Disclosed herein is a coated composite comprising a seal coat disposed on a composite material wherein the seal coat comprises protective particles and a matrix deposited by vapor phase.

In one embodiment, the seal coat further comprises particles that are a reaction product of the composite material, byproducts of the composite material, or a combination thereof with the protective particles.

In another embodiment, the protective particles comprise metal particles, metal oxides, metal carbides, metal nitrides, metal borides, metal silicides, metal oxycarbides, metal oxynitrides, metal boronitrides, metal carbonitrides, metal borocarbides, or a combination thereof.

In another embodiment, the metals that form the metal oxides, metal carbides, metal nitrides, metal borides, metal silicides, metal oxycarbides, metal oxynitrides, metal boronitrides, metal carbonitrides, metal borocarbides are rare earth metals or transition metals.

In yet another embodiment, the metal oxides comprise rare earth metal oxides, transition metal oxides, oxides of metalloids, or a combination thereof wherein the rare earth metal oxide includes yttria, ytterbium oxide, gadolinum oxide, or a combination thereof; wherein the transition metal oxide includes hafnia, zirconia, titania, or a combination thereof and wherein the oxides of metalloids include alumina, stannic oxide, or a combination thereof.

In yet another embodiment, the protective particles comprise Cr, Mo, $Si_3N_4$, HfC, ZrC, $HfB_2$, TaC, TaB, or a combination thereof.

In yet another embodiment, the seal coat comprises one or more oxides of Cr, Al, Hf, Zr, Ta, Y, Yb, Si, or a combination thereof.

In yet another embodiment, the protective particles further comprise SiC fibers, hollow particles or a combination thereof.

In yet another embodiment, the composite material comprises a matrix and the composite material matrix has the same composition as the seal coat matrix.

In yet another embodiment, the composite material matrix and the seal coat matrix both comprise silicon carbide.

In yet another embodiment, the composite material comprises a matrix and the composite material matrix has different composition than the seal coat matrix.

In yet another embodiment, the composite material matrix comprises silicon carbide.

In yet another embodiment, the protective particles include metal oxides, boron containing particles, hollow spheres, or a combination thereof.

In yet another embodiment, the metal oxides are operative to react with a silica layer formed on silica carbide in the composite material to limit volumetric expansion to the seal coat.

In yet another embodiment, the boron containing particles are operative to reduce viscosity of the silica layer and to provide self healing capabilities to the silica.

Disclosed herein is a method of applying a seal coat to a composite material comprising forming a mixture of a reactant gas and protective particles. The mixture is contacted with a heated composite material to produce vapors that deposit as solids on the composite material.

The solids and the protective particles are co-deposited on the composite material to form a seal coat.

In one embodiment, the composite material has a matrix and the composition of the composite material matrix is the same as the composition of the solids.

In another embodiment, the composite material has a matrix and the composition of the composite material matrix is different from the composition of the solids.

In yet another embodiment, the protective particles comprise of Cr, Mo, $Si_3N_4$, HfC, ZrC, $HfB_2$, TaC, TaB or a combination thereof.

In yet another embodiment, the seal coat further comprises particles that are a reaction product of the composite material, byproducts of the composite material, or a combination thereof with the protective particles.

In addition to one or more of the features described above, or as an alternative to any of the foregoing embodiments, the protective particles may further include SiC fibers, hollow particles, or a combination thereof.

In addition to one or more of the features described above, or as an alternative to any of the foregoing embodiments, the composite material has a matrix and the composite material matrix has the same composition as the seal coat matrix. The composite material matrix and the seal coat matrix may both include silicon carbide.

In addition to one or more of the features described above, or as an alternative to any of the foregoing embodiments, the composite material has a matrix and the composite material matrix has different composition than the seal coat matrix. The composite material matrix may include silicon carbide or the seal coat matrix may include silicon carbide.

Also disclosed is a method of applying a seal coat to a composite material including forming a mixture of a reactant gas and protective particles; contacting the mixture with a heated composite material to produce vapors that deposit as solids on the composite material; and co-depositing the solids and the protective particles on the composite material to form a seal coat.

In addition to one or more of the features described above, or as an alternative to any of the foregoing embodiments, the composite material has a matrix and the composition of the composite material matrix is the same as the composition of the solids.

In addition to one or more of the features described above, or as an alternative to any of the foregoing embodiments, the composite material has a matrix and the composition of the composite material matrix is different from the composition of the solids.

In addition to one or more of the features described above, or as an alternative to any of the foregoing embodiments, the protective particles further include SiC fibers, hollow particles or a combination thereof.

BRIEF DESCRIPTION OF THE DRAWINGS

The following descriptions should not be considered limiting in any way. With reference to the accompanying drawings, like elements are numbered alike:

The FIGURE is a depiction of a CMC part with a seal coat and an environmental barrier coating disposed on the CMC part.

DETAILED DESCRIPTION

A detailed description of one or more embodiments of the disclosed apparatus and method are presented herein by way of exemplification and not limitation with reference to the FIGURES.

As discussed above, composite materials, particularly ceramic matrix composite materials, can suffer from degradation after exposure to operating environments, particularly environments that include exposure to water vapor at high speeds. Frequently ceramic matrix composites are protected by a coating but coatings can crack or delaminate, leaving portions of the composite material exposed. Exposure can lead to oxidation of the ceramic matrix composite and damage from cracking.

Disclosed herein is a method of applying a seal coat to a composite material. The method includes forming a mixture of a reactant gas and protective particles; contacting the mixture with a heated composite material to produce vapors that deposit as solids on the composite material; and co-depositing the solids and the protective particles on the composite material to form a seal coat. The solids that deposit on the composite material form a matrix around the protective particles and the combination of the matrix and protective particles form the seal coat. The seal coat matrix may be the same as or different from the composite material matrix. In some situations it is advantageous for the seal coat matrix and the composite material matrix to have a similar composition or the same composition in order to facilitate adhesion and to match thermal properties.

The seal coat is an external coating done after machining that seals composite matrix edges where cut fibers and interfaces are exposed and also where large holes from the incomplete infiltration of large pores of the microstructure are present. Seal coats have been traditionally manufactured by chemical vapor deposition/chemical vapor infiltration. The present seal coat has the advantage that the composition can be more complex (than those currently commercially available) and prevent rapid degradation during exposure to the environment once the environmental barrier coat (EBC) fails. The method disclosed herein (as well as the seal coat disclosed herein) have the advantage of filling rapidly large voids that may still be present in the microstructure.

The FIGURE is a schematic diagram that depicts a coating that may be used to protect the matrix in a ceramic matrix composite on an article 100. The article 100 comprises a ceramic matrix composite 106 that is protected by a seal coat 104 and an environmental barrier coating (EBC) 102. The environmental barrier coating 102 will protect the CMCs against the corrosive effects of high temperatures and the environment. They function is to protect the structural CMC material against high-temperature water vapor attack and subsequent corrosion. Suitable examples of the environmental barrier coating are silicon, rare earth disilicates (e.g. $Yb_2Si_2O_7$), rare earth monosilicates ($Yb_2SiO_5$), alkaline earth alumino silicates (e.g. $CaAl_2Si_2O_7$), hafnium oxide, hafnium silicate, zirconium silicate, rare-earth stabilized zirconia (7 wt. % $Y_2O_3$ stabilized $ZrO_2$) and combinations thereof. The EBC may consist of multiple layers. Details of EBC composition and preparation are provided in U.S. Pat. Nos. U.S. Pat. No. 10,392,312 B2 and U.S. Pat. No. 9,611,181 B2, the entire contents of which are hereby incorporated by reference.

The seal coat 104 may comprise a variety of protective particles 105 that facilitate different protective behaviors in the seal coat and protect the ceramic matrix composite from environmental and thermal degradation. The protective particles 105 interact with metal oxide (e.g., silica particles) particles 107 that are generated by oxidation of the matrix material used in the composite matrix. The protective particles may comprise metals, metal oxides, metal carbides, metal nitrides, metal borides, metal silicides, metal oxycarbides, metal oxynitrides, metal boronitrides, metal carbonitrides, metal borocarbides, or the like, or a combination thereof. The metals that form the metal oxides, metal carbides, metal nitrides, metal borides, metal silicides, metal oxycarbides, metal oxynitrides, metal boronitrides, metal carbonitrides, metal borocarbides can be rare earth metals or transition metals. In an embodiment, oxides of metalloids can also be used in the protective particles. The protective particles may also include chopped fibers, glass beads, either separately or in addition to the particles listed above.

These protective particles react with environmental byproducts of the CMC matrix and fibers (e.g., SiO2 produced by the oxidation of SiC used in the CMC matrix) to produce complex metal oxides that contain two or more elements in addition to oxygen. The reaction product (of the protective particles with the environmental byproduct) promotes viscosity reduction of the seal coat, which may facilitate self-healing. It can promote coefficient of thermal expansion (CTE) matching between the CMC matrix and the seal coat, which reduces delamination. The resulting protective particles are therefore a combination of the original protective particles (metal oxides, metal carbides, metal nitrides, metal borides, metal silicides, metal oxycarbides, metal oxynitrides, metal boronitrides, metal carbonitrides, metal borocarbides) and the reaction product of these protective particles with the CMC matrix, byproducts of the CMC matrix, or a combination thereof.

For example, in ceramic matrix composites that have silicon carbide as a matrix, the silicon carbide at the surface often gets converted to silica. This silica can undergo cracking exposing the matrix to further environmental degradation. The protective particles can include metal oxides (e.g., rare earth metal oxides, alumina, zirconia, titania, and the like), metal silicides (e.g. hafnium silicide and the like), metal nitrides (e.g. silicon nitride and the like), boron containing particles (e.g., boria (boron trioxide), metal borides, and the like), chopped fibers (carbon fibers, SiC fibers, and the like), and lower conductivity particles (e.g., oxides and hollow spheres that reduce coefficient of thermal conductivity (CTE) mismatch that can interact with the silicon particles (see FIGURE) to minimize the degradation. Each of these particles will be detailed below along with their functions.

In an embodiment, the particles used in the seal coat 104 may comprise metal oxide particles that function to limit the formation of silica on the silicon carbide matrix material. As detailed above, a layer of silica (or silica particles) is often formed on the silicon carbide matrix. This layer of silica is susceptible to recession in the combustion environment of a gas turbine. The addition of certain metal oxide particles to the seal coat 104 can react with the silica layer to form a compound that is more stable in the combustion atmosphere and thus prevent failure of the CMC composite. The metal oxide particles can also react with the silicon oxide to form lower thermal conductivity regions which minimize the heat flux from the combustion gas to the silicon carbide matrix. In addition, the formation of silica from the SiC produces a volume expansion. The reaction of the silicon oxide with the metal oxide particles limits volumetric expansion and may even produce a volumetric contraction. In other words, the protective particles may react with the CMC matrix or byproducts of the CMC matrix (produced as a result of interaction with the environment) to produce products (preferably in particular form) that limit volumetric expansion of the seal coat or alternatively, produce a volumetric contraction of the seal coat (when the part operates at elevated temperatures).

Metal oxides that may be used include rare earth metal oxides, transition metal oxides, oxides of metalloids, or a combination thereof. Metal oxides may also be used in the form of hollow spheres—this is detailed below.

Examples of metal oxides include rare earth metal oxides. Examples or rare earth metal oxides include oxides of lanthanum, cerium, praseodymium, neodymium, promethium, samarium, europium, gadolinium, terbium, dysprosium, holmium, erbium, thulium, ytterbium, lutetium, scandium, yttrium, or a combination thereof. Preferred rare earth metal oxides include yttria ($Y_2O_3$), ytterbium oxide ($Yb_2O_3$), gadolinum oxide ($Gd_2O_3$), or a combination thereof. Transition metal oxide particles that may be used include hafnia ($HfO_2$), zirconia ($ZrO_2$), titania ($TiO_2$), or a combination thereof. Oxides of metalloids that may be used include alumina ($Al_2O_3$), stannic oxide ($SnO_2$), or a combination thereof.

For example, when yttria particles are added to the seal coat, they can react with the silica formed on the silicon carbide to produce $Y_2Si_2O_7$. Similarly, when hafnia reacts with silica it produces $HfSiO_4$ and alumina reacts with silica to produce mullite. The conversion of silica to these metal oxides (that have more than one metal) produces a volumetric contraction from the volumetric expansion that occurs when the silicon carbide is converted to silica.

The volume fraction of metal oxide added to the seal coat is an amount that is effective to adjust the coefficient of thermal expansion to a suitable level. The metal oxide particles may be present in amounts of 0.5 to 10 vol %, preferably 0.75 to 5 vol %, based on a total weight of the seal coat. The metal oxide particles may have average particle sizes that are in the nanometer or micrometer size range. Average particle sizes are 5 nanometers to 50 micrometers, preferably 10 nanometers to 1 micrometers, and more preferably 50 nanometers to 0.5 micrometers. In an embodiment, the particles may have a bimodal size distribution with a first set of larger particles of size 1 to 50 micrometers and second set of smaller particles of size 5 nanometers to 5 micrometers. The larger particles can be deposited rapidly and are preferably used for filing gaps and holes, while the smaller particles can be preferably used for tailoring chemistry and reactivity.

Other particles that may be included in the seal coat include boron containing particles. Boron tends to reduce the viscosity of the silica formed on the CMC. The reduction in viscosity of the silica (formed on the CMC) at operating temperatures facilitates self-healing of cracks formed in the silica. Boron containing particles include borosilicate glass (BSG) particles, (e,g. pyrex), boria and metal borides (such as, for example, $HfB_2$, $ZrB_2$, or a combination thereof silicon hexaboride ($SiB_6$), boron carbide ($B_4C$), or a combination thereof. Mixtures of BSG, boria and metal borides may also be used.

The volume fraction of boron containing particles added to the seal coat is an amount that is effective to limit the volumetric expansion to a suitable level. The silica formed from the silicon carbide of the CMC produces a volumetric expansion. While the boron reduces the viscosity of the molten silica, it also produces a volumetric expansion. It is therefore desirable to add boron containing particles in amounts so as not to produce too much volumetric expansion and to maintain the coefficient of thermal expansion of the seal coat to a desirable level. The boron containing particles may be present in amounts of 0.5 to 5 vol %, preferably 0.75 to 3 vol %, based on a total weight of the seal coat. The boron containing particles may have average particle sizes that are in the nanometer or micrometer size range. Average particle sizes as determined by the radius of gyration are 5 nanometers to 10 micrometers, preferably 10 nanometers to 1 micrometers and more preferably 50 nanometers to 0.5 micrometers. As noted above, these particles may also have a bimodal particle size distribution similar to that detailed above for the metal oxide particles.

Hollow spheres may also be added to the seal coat to facilitate a CTE match between the seal coat and the silica formed from the silicon carbide. In an embodiment, the hollow spheres are added to the seal coat accommodate some of the volume expansion as they oxidize upon reaction between the seal coat and the silica formed from the silicon carbide at its surface. These hollow particles generally comprise metal oxides but can be of any material cited above. Metal oxides include hafnia, yttria, or a combination thereof. These hollow spheres have average particle sizes of 1 micrometers to 70 micrometers, preferably 10 to 50 micrometers.

Other protective particles may be included in the seal coat 104. These particles can be metal particles, metal carbide particles, metal nitrides, metal borides, or the like. Exemplary protective particles include particles of Cr, Mo, $Si_3N_4$, HfC, ZrC, $HfB_2$, TaC, TaB, SiC, or a combination thereof. The protective particle has a composition different from the matrix material. These particles may form low viscosity oxides during exposure to the operating environment. The low viscosity oxides may flow and seal any cracks in the seal coat so that the seal coat is self-repairing and provides robust protection to the underlying composite material. The presence of the protective particles and any resulting low viscosity oxides can also retard crack growth in the seal coat through blunting and/or branching.

Protective particles may further include short (chopped) silicon carbide (SiC) fibers, silicon nitride ($Si_3N_4$) fibers, carbon fibers, hollow shell particles or combinations thereof. Silicon carbide fibers, silicon nitride carbon fibers, and hollow shell particles may have an interface coating such as hexamethyldisilazane or trichloromethylsilane. These chopped fibers may be added to act as crack growth inhibitors by acting to block the path of a propagating crack. Carbon fibers are generally produced by drawing pitch or polyacrylonitrile (PAN) fibers at elevated temperatures of 1500 to 2000° C. The fibers (both the silicon carbide chopped fibers and the carbon fibers) have diameters of 1 to 10 micrometers and can have average aspect ratios of 2 to 50, preferably 5 to 10.

These chopped fibers are added to the seal coat in an amount effective to prevent a CTE mismatch that can result in delamination. The protective particles may have an average particle size as determined by the radius of gyration of less than or equal to 20 micrometers, preferably less than 10 micrometers, but greater than 0.1 micrometers. The protective particles are thought to provide nucleation sites for the matrix material. Use of nanometer sized particles translates to more nucleation sites for an amount (by weight) of protective particles and a finer crystal structure in the seal coat.

Exemplary reactant gases that may be used to form the matrix in the seal coat 104 include precursors to the following matrix materials: silicon carbide, silicon nitride, hafnium carbide, tantalum carbide, tungsten carbide, boron carbide, silicon nitride, boron nitride, hafnium nitride, aluminum nitride, silicon oxide, aluminum oxide, hafnium oxide, tantalum oxide, titanium oxide, barium titanium oxide, strontium titanium oxide, tungsten silicide, and titanium silicide. In an embodiment, the seal coat may comprise a matrix that comprises one or more oxides of Cr, Al, Hf, Zr, Ta, Y, Yb, Si, or a combination thereof. In another embodiment, the seal coat may further include one or more nitrides, silicides or oxides of Cr, Si, Hf, Zr, B, Ta, Al, Mg, Ca, Sr Y, La, Ce, Pr, Pm, Sm, Eu, Gd, Tb, Dy, Ho, Er, Tm, Yb, Lu, or a combination thereof.

These matrix materials and the corresponding reactant gases are known to those of skill in the art.

It is contemplated that the particles may be generated within the reactor just prior to co-deposition.

The mixture of the reactant gas and protective particles may include the protective particles in an amount of 1 to 50, or 15 to 45 volume percent based on the combined volume of the reactant gas and protective particles.

The mixture of the reactant gas and protective particles may further include a carrier gas. Exemplary carrier gasses include hydrogen, nitrogen, argon and combinations thereof.

As mentioned above the composite material is heated prior to and during co-deposition. The composite material is heated to a temperature necessary for decomposition of the reactant gas. For example, when the reactant gas is $CH_3SiCl_3$ the composite material is heated to a temperature of 800-1800° C.

After the seal coat is deposited on the composite material the seal coat may be heat treated at a temperature up to 1700° C., or at a temperature of 1500 to 1600° C. The temperature of the heat treatment may be based on the reinforcing fiber stability.

As mentioned above, the seal coat matrix and the composite matrix may have the same composition or a different composition. Exemplary matrix materials for the seal coat or the composite matrix (also referred to as composite material) include silicon carbide, boron carbide, hafnium carbide, zirconium carbide, tantalum carbide, niobium carbide, and combinations thereof. It is contemplated that combinations of the foregoing carbides includes layers having different matrices.

It is further contemplated that the composition of the seal coat may vary over the thickness of the seal coat. For example, the quantity of protective particles may vary over the thickness of the seal coat. Varying the composition of the seal coat may facilitate bonding with an optional bond coat and/or thermal barrier coating.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A coated composite comprising a seal coat disposed on a composite material wherein the seal coat comprises protective particles and a silicon carbide matrix deposited by vapor phase; wherein the composite material comprises a matrix and the composite material matrix has the same composition as the seal coat matrix.

2. The coated composite of claim 1, wherein the seal coat further comprises particles that are a reaction product of the composite material, byproducts of the composite material, or a combination thereof with the protective particles.

3. The coated composite of claim 1, wherein the protective particles comprise metal particles, metal oxides, metal carbides, metal nitrides, metal borides, metal silicides, metal oxycarbides, metal oxynitrides, metal boronitrides, metal carbonitrides, metal borocarbides, or a combination thereof.

4. The coated composite of claim 1, wherein the metals that form the metal oxides, metal carbides, metal nitrides, metal borides, metal silicides, metal oxycarbides, metal oxynitrides, metal boronitrides, metal carbonitrides, metal borocarbides are rare earth metals or transition metals.

5. The coated composite of claim 3, wherein the metal oxides comprise rare earth metal oxides, transition metal oxides, oxides of metalloids, or a combination thereof; wherein the rare earth metal oxide includes yttria, ytterbium oxide, gadolinum oxide, or a combination thereof, wherein the transition metal oxide includes hafnia, zirconia, titania, or a combination thereof and wherein the oxides of metalloids include alumina.

6. The coated composite of claim 1, wherein the protective particles comprise Cr, Mo, $Si_3N_4$, HfC, ZrC, $HfB_2$, TaC, TaB, or a combination thereof.

7. The coated composite of claim 1, wherein the protective particles comprise one or more oxides of Cr, Al, Hf, Zr, Ta, Y, Yb, Si, or a combination thereof.

8. The coated composite of claim 1, wherein the protective particles further comprise SiC fibers, carbon fibers, hollow particles or a combination thereof.

9. The coated composite of claim 1, wherein the protective particles include metal oxides, boron containing particles, hollow spheres, or a combination thereof.

10. The coated composite of claim 9, wherein the metal oxides are operative to react with a silica layer formed on silica carbide in the composite material to promote volume contraction of the seal coat.

11. The coated composite of claim 9, wherein the boron containing particles are operative to reduce viscosity of a silica layer and to provide self healing capabilities to the silica.

12. A method of applying a seal coat to a composite material according to claim 1 comprising
   forming a mixture of a reactant gas and protective particles;
   contacting the mixture with a heated composite material to produce vapors that deposit as solids on the composite material; and
   co-depositing the solids and the protective particles on the composite material to form a seal coat.

13. The method of claim 12, wherein the protective particles comprise of Cr, Mo, $Si_3N_4$, HfC, ZrC, $HfB_2$, TaC, TaB or a combination thereof.

14. The method of claim 12, wherein the seal coat further comprises particles that are a reaction product of the composite material, byproducts of the composite material, or a combination thereof with the protective particles.

* * * * *